(12) United States Patent
Doi et al.

(10) Patent No.: US 9,664,546 B2
(45) Date of Patent: May 30, 2017

(54) THERMAL AIRFLOW SENSOR

(71) Applicant: Hitachi Automotive Systems, Ltd., Hitachinaka-shi, Ibaraki (JP)

(72) Inventors: Ryosuke Doi, Hitachinaka (JP); Hiroshi Nakano, Tokyo (JP); Keiji Hanzawa, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 8 days.

(21) Appl. No.: 14/410,713

(22) PCT Filed: Jun. 10, 2013

(86) PCT No.: PCT/JP2013/065912
§ 371 (c)(1),
(2) Date: Dec. 23, 2014

(87) PCT Pub. No.: WO2014/002736
PCT Pub. Date: Jan. 3, 2014

(65) Prior Publication Data
US 2015/0323360 A1    Nov. 12, 2015

(30) Foreign Application Priority Data

Jun. 29, 2012    (JP) .................................. 2012-146286

(51) Int. Cl.
*G01F 1/692* (2006.01)
*H01L 21/56* (2006.01)
(Continued)

(52) U.S. Cl.
CPC .............. *G01F 1/692* (2013.01); *G01F 1/684* (2013.01); *G01F 1/6842* (2013.01);
(Continued)

(58) Field of Classification Search
CPC ...................................................... G01F 1/692
See application file for complete search history.

(56) References Cited

U.S. PATENT DOCUMENTS

| 2010/0077851 A1 | 4/2010 | Minamitani et al. |
| 2010/0242591 A1* | 9/2010 | Nakano ................... G01F 1/692 |
| | | 73/204.26 |

(Continued)

FOREIGN PATENT DOCUMENTS

| CN | 101713676 A | 5/2010 |
| JP | 3610484 B2 | 1/2005 |

(Continued)

OTHER PUBLICATIONS

International Search Report (PCT/ISA/210) dated Jul. 16, 2013, with English translation (two (2) pages).

*Primary Examiner* — Ryan Walsh
(74) *Attorney, Agent, or Firm* — Crowell & Moring LLP

(57) ABSTRACT

An object of the present invention is to improve the reliability of a product in which a semiconductor device is partially exposed when sealed with resin. In achieving the above object and according to this invention, there is provided a thermal airflow sensor including: a semiconductor substrate having a thin-wall portion, a heating resistor provided over the thin-wall portion, and resistance temperature detectors installed upstream and downstream of the heating resistor; a protective film provided over the semiconductor substrate; and a resin that seals the semiconductor substrate, the resin further including an exposure portion for partially exposing an area including the thin-wall portion. The protective film is provided in a manner seamlessly enclosing the heating resistor, the protective film having an outer peripheral edge located outside the thin-wall portion and over the exposure portion.

17 Claims, 15 Drawing Sheets

(51) Int. Cl.
*H01L 49/02* (2006.01)
*G01F 1/684* (2006.01)
*G01P 5/12* (2006.01)

(52) U.S. Cl.
CPC .............. *G01F 1/6845* (2013.01); *G01P 5/12* (2013.01); *H01L 21/565* (2013.01); *H01L 28/20* (2013.01); *H01L 2224/05553* (2013.01); *H01L 2224/48091* (2013.01); *H01L 2224/48247* (2013.01); *H01L 2224/49171* (2013.01); *H01L 2924/10158* (2013.01); *H01L 2924/181* (2013.01); *H01L 2924/1815* (2013.01)

(56) References Cited

U.S. PATENT DOCUMENTS

| | | | |
|---|---|---|---|
| 2011/0023597 A1* | 2/2011 | Nakano | G01F 1/6845 73/204.25 |
| 2011/0140211 A1* | 6/2011 | Kono | G01F 1/684 257/415 |
| 2012/0060599 A1* | 3/2012 | Morino | G01F 5/00 73/204.11 |

FOREIGN PATENT DOCUMENTS

| | | | |
|---|---|---|---|
| JP | 2009-270930 A | | 11/2009 |
| JP | 2011-050787 | * | 2/2011 |
| JP | 2011-119500 A | | 6/2011 |

* cited by examiner

F I G . 8
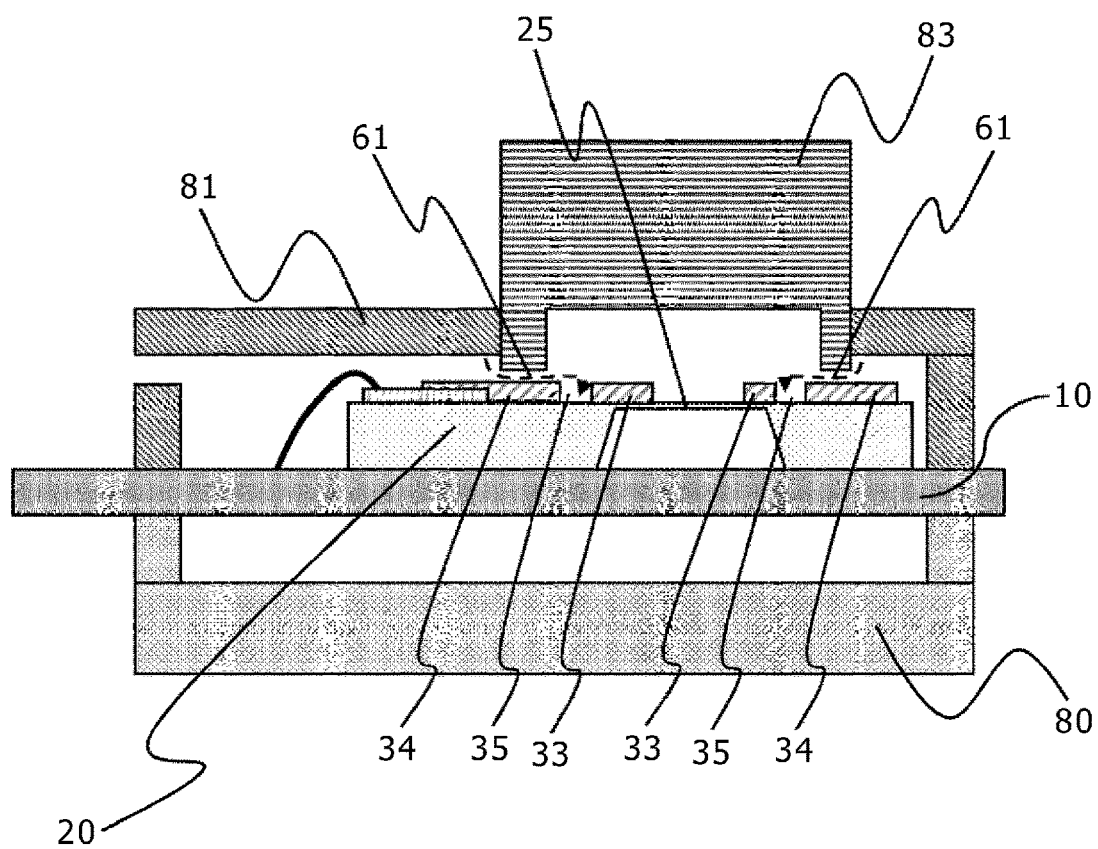

THERMAL AIRFLOW SENSOR

TECHNICAL FIELD

The present invention relates to a sensor that detects physical quantities. More particularly, the invention relates to a thermal airflow sensor.

BACKGROUND ART

Thermal airflow sensors have conventionally been a mainstream airflow sensor that is installed in the intake air passage of internal combustion engines, such as those of automobiles, to measure intake air volume since the thermal airflow sensors are capable of directly detecting amount of air.

Recently, there has been developed an airflow sensor formed by having resistors and insulating layer films deposited on a silicon substrate by use of semiconductor micromachining technology, part of the silicon substrate being removed thereafter by a solvent represented by KOH to form a thin-wall portion. This airflow sensor is drawing attention because it has high-speed responsiveness and is capable of detecting counter flows thanks to its quick response. In recent years, for the purpose of reducing the number of components constituting the substrate portion (printed substrate, silicon substrate, etc.), study has been underway to form a structure in which this airflow sensor is mounted on a lead frame of which the periphery is molded in resin.

PRIOR ART LITERATURE

Patent Document

Patent Document 1: Japanese Patent No. 3610484

SUMMARY OF THE INVENTION

Problem to be Solved by the Invention

An existing thermal airflow sensor described in Patent Document 1 is an invention in which the surface of a flow sensor element is provided with a protective film made of an organic material for the purpose of improving the reliability of the thin-wall portion formed by removing part of the silicon substrate from its back side. According to Patent Document 1, the insulating film of the thin-wall portion is given enhanced resistance to dust. With this invention, however, there is room for consideration in partially exposing an area that includes the thin-wall portion in a structure in which the flow sensor element is adhesively attached to a member such as the lead frame, with the periphery of the flow sensor element sealed with resin.

When resin molding is performed for partial exposure, it is general practice to press a metal mold, an insertion die or the like onto the periphery of the thin-wall portion over a semiconductor detection element during molding so that a mold resin material will not be formed in the exposed portion. A principal method for pressing the insertion die involves controlling the amount of movement of the insertion die. Where mass production is considered, the amount of movement to be set is always constant; the amount of movement is left unadjusted from one product to another. At this point, if the pressing force on the insertion die is not sufficient, the mold resin could flow into the exposed portion. To avoid this eventuality requires pressing the insertion die toward the semiconductor device with a certain level of force. If the pressing force is excessive, the semiconductor device can be deformed. Thus where the area including the thin-wall portion is to be partially exposed when sealed with resin, the force with which to press the insertion die has a margin to certain extent.

Also, there are variations in film thickness as well as in adhesive thickness over the detection element from one product to another. As a result, the height of the semiconductor device mounted on the lead frame varies. It follows that that the force applied from the insertion die or the contact distance thereto varies in each product. This further reduces the permissible range of the pressing force toward the insertion die, leading to a decline in throughput yield.

An object of the present invention is to improve the reliability of a product in which a semiconductor device is partially exposed when sealed with resin.

Means for Solving the Problem

In achieving the above object and according to the present invention, there is provided a thermal airflow sensor including: a semiconductor substrate having a thin-wall portion, a heating resistor provided over the thin-wall portion, and resistance temperature detectors installed upstream and downstream of the heating resistor; a protective film provided over the semiconductor substrate; and a resin that seals the semiconductor substrate, the resin further including an exposure portion for partially exposing an area including the thin-wall portion. The protective film is provided in a manner seamlessly enclosing the heating resistor, the protective film having an outer peripheral edge located outside the thin-wall portion and over the exposure portion.

Effect of the Invention

The present invention improves the reliability of a product in which a semiconductor device is partially exposed when sealed with resin.

BRIEF DESCRIPTION OF THE DRAWINGS

FIG. 1(a) is a lateral sectional view and FIG. 1(b) is an overhead topographic view.

FIG. 2(a) is a lateral sectional view and FIG. 2(b) is an overhead topographic view.

FIG. 5(a) is a lateral sectional view and FIG. 5(b) is an overhead topographic view.

FIG. 6(a) is a lateral sectional view and FIG. 6(b) is an overhead topographic view.

FIG. 8 is a schematic explanatory view showing how the mold resin flows out in the second embodiment.

FIG. 10(a) is a lateral sectional view and FIG. 10(b) is an overhead topographic view.

MODE FOR CARRYING OUT THE INVENTION

Figure 15:
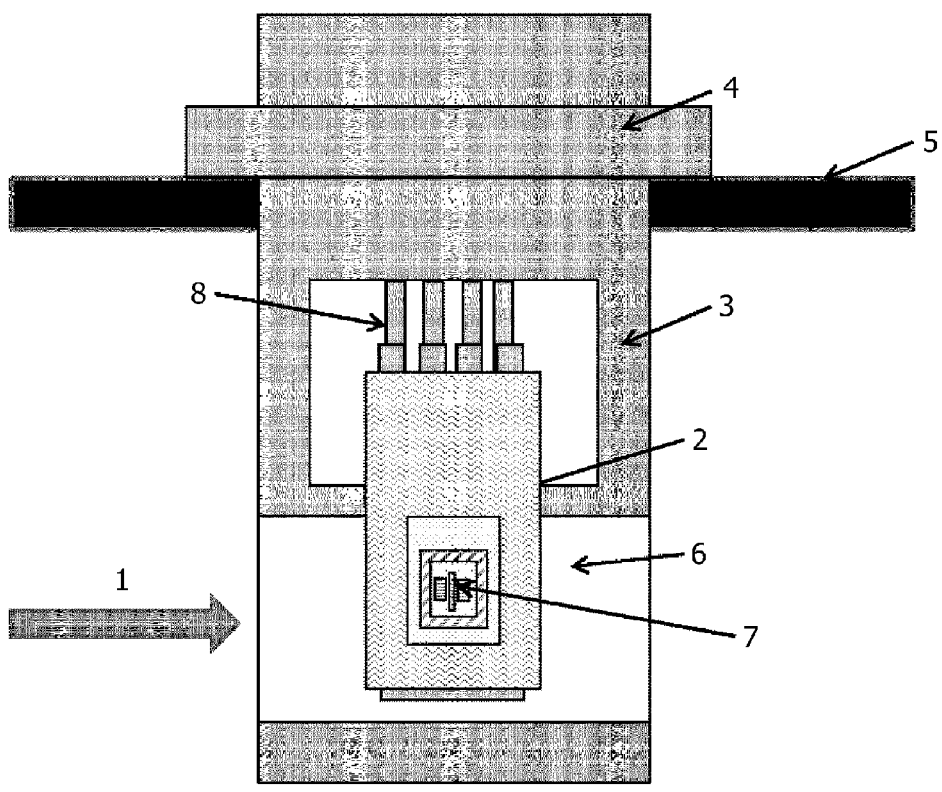
FIG. 15 is a structural view showing a thermal airflow sensor according to the present invention.

The thermal airflow sensor according to the present invention will now be explained with reference to FIG. 15.

The thermal airflow sensor of the present invention includes a housing 3 and a semiconductor package 2 installed inside an intake pipe 5 that feeds intake air 1 to an automobile internal combustion engine (not shown).

The housing 3 includes a connector terminal 8 coupled electrically to the semiconductor package 2, a flange portion 4 that fixes the housing 3 to the intake pipe 5, and an auxiliary passage 6 that admits part of the intake air 1.

The semiconductor package 2 is formed by having a lead frame 10, a semiconductor substrate 20, circuit elements, and a temperature sensor sealed integrally with a mold resin 60. The semiconductor package 2 also has a partially exposed area (not covered with the mold resin 60) so as to expose a flow rate detection portion 7 to the intake air. The flow rate detection portion 7 is installed inside the auxiliary passage 6 and calculates the flow rate of the intake air 1 from the flow rate of a fluid flowing through the auxiliary passage 6.

The first embodiment of the present invention will now be explained with reference to FIGS. 1 through 4.

The structural views of the sensor element constituting the first embodiment of this invention will be explained below with reference to FIGS. 1 and 2. Here, FIG. 1 is a set of structural views of the sensor element yet to be molded as the first embodiment, and FIG. 2 is a set of structural views of the sensor element molded as the first embodiment.

Figure 1:
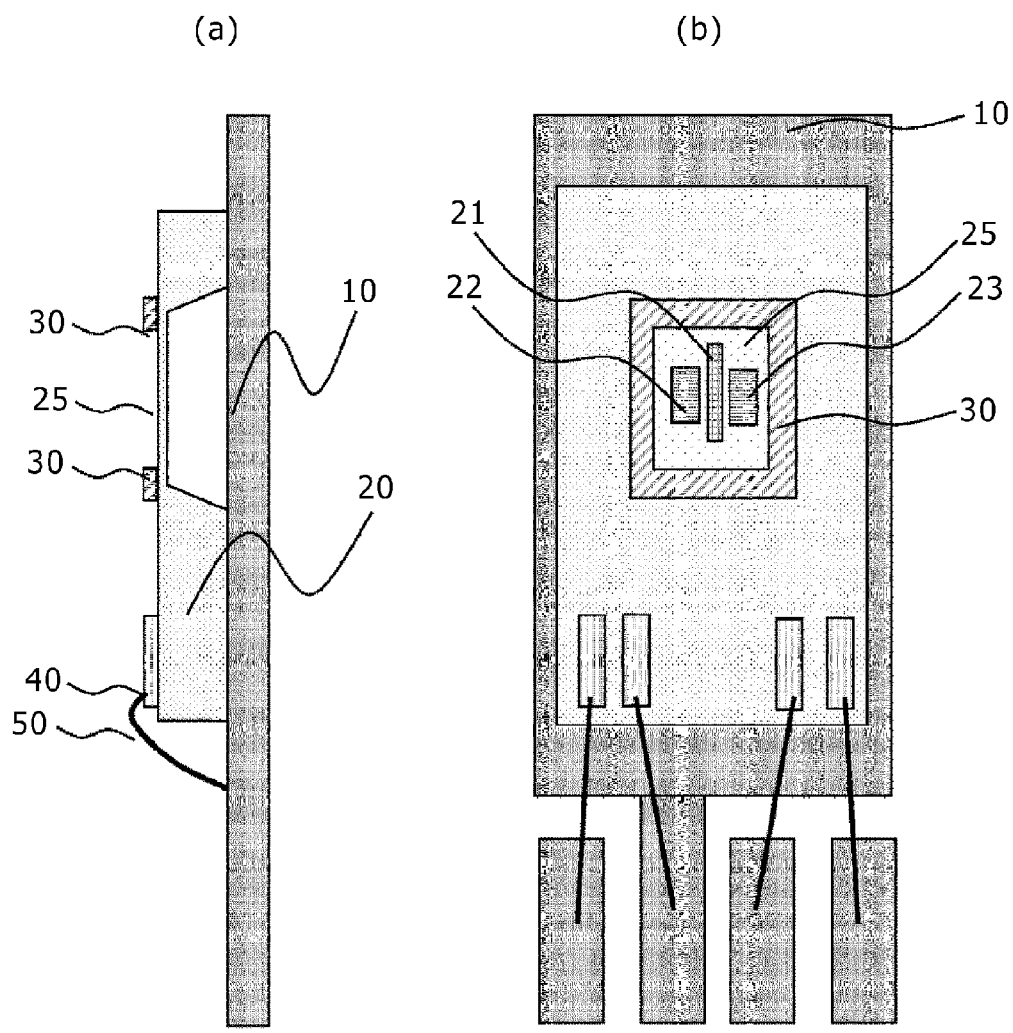
FIG. 1 is a set of structural views showing a sensor element yet to be molded as a first embodiment of the present invention, where

As shown in FIG. 1, the thermal airflow sensor has a semiconductor substrate 20 typically made of silicon and deposited with insulating film and resistor layers. A thin-wall portion 25 is formed by removing part of the back side of the semiconductor substrate 20 typically by use of potassium hydroxide (KOH). A heating resistor 21, an upstream resistance temperature detector 22, and a downstream resistance temperature detector 23 are formed over the thin-wall portion 25. The temperature of the heating resistor 21 is subjected to feedback control so that the temperature of the heating resistor 21 remains higher than that of the intake air 1 by predetermined degrees. The flow rate of the intake air 1 is measured from information about the difference between the temperature measured by the upstream resistance temperature detector 22 and the temperature measured by the downstream resistance temperature detector 23. An organic protective film 30 typically made of polyimide is formed over the surface of the thermal airflow sensor. The organic protective film 30 is coated once, uniformly, all over the sensor surface by use of a coating machine such as a spinner. Thereafter, the coat is partially removed by etching through patterning technology to form a stagger between the semiconductor substrate 20 and the organic protective film 30. The organic protective film 30 is shaped seamlessly to enclose the heating resistor 21. Because the flow rate of the intake air is measured with the heating resistor 21, upstream resistance temperature detector 22 and downstream resistance temperature detector 23, these three detectors need to be exposed to the intake air, so that they are not covered with the organic protective film. Also, Al wiring 40 is formed over the surface of the thermal airflow sensor. The Al wiring 40 is electrically coupled to the lead frame 10 by means of a bonding wire 50 such as a gold wire. The semiconductor substrate 20 is fixed to the lead frame 10 with adhesive or the like.

Figure 2:
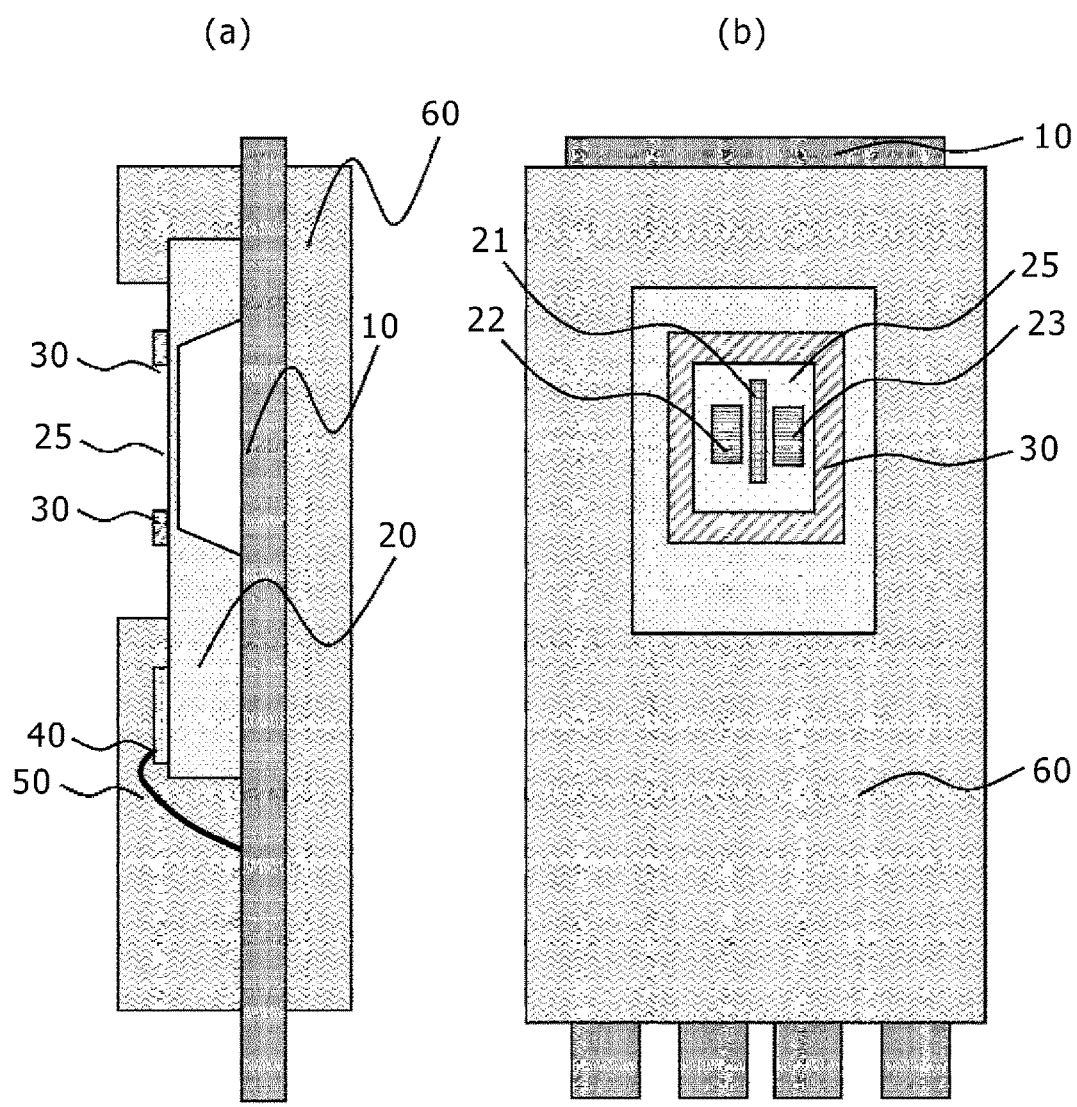
FIG. 2 is a set of structural views showing the sensor element molded as the first embodiment, where

As shown in FIG. 2, the semiconductor substrate and lead frame 10 are sealed with the mold resin 60. Here, because the heating resistor 21, upstream resistance temperature detector 22 and downstream resistance temperature detector 23 need to be exposed to a medium to be measured for flow rate detection, there is provided a structure in which an area including the flow rate detection portion 7 is partially exposed from the mold resin 60 (not covered therewith). Furthermore, the peripheral edge of the organic protective film 30 enclosing the heating resistor 21 is located outside the thin-wall portion 25 in a manner partially exposing the organic protective film 30. With this structure, even if the resin leaks out of between the surface of the thermal airflow sensor and the insertion die 83 during molding, the leak is stemmed by the organic protective film 30 so that the resin will not reach the thin-wall portion 20.

Figure 3:
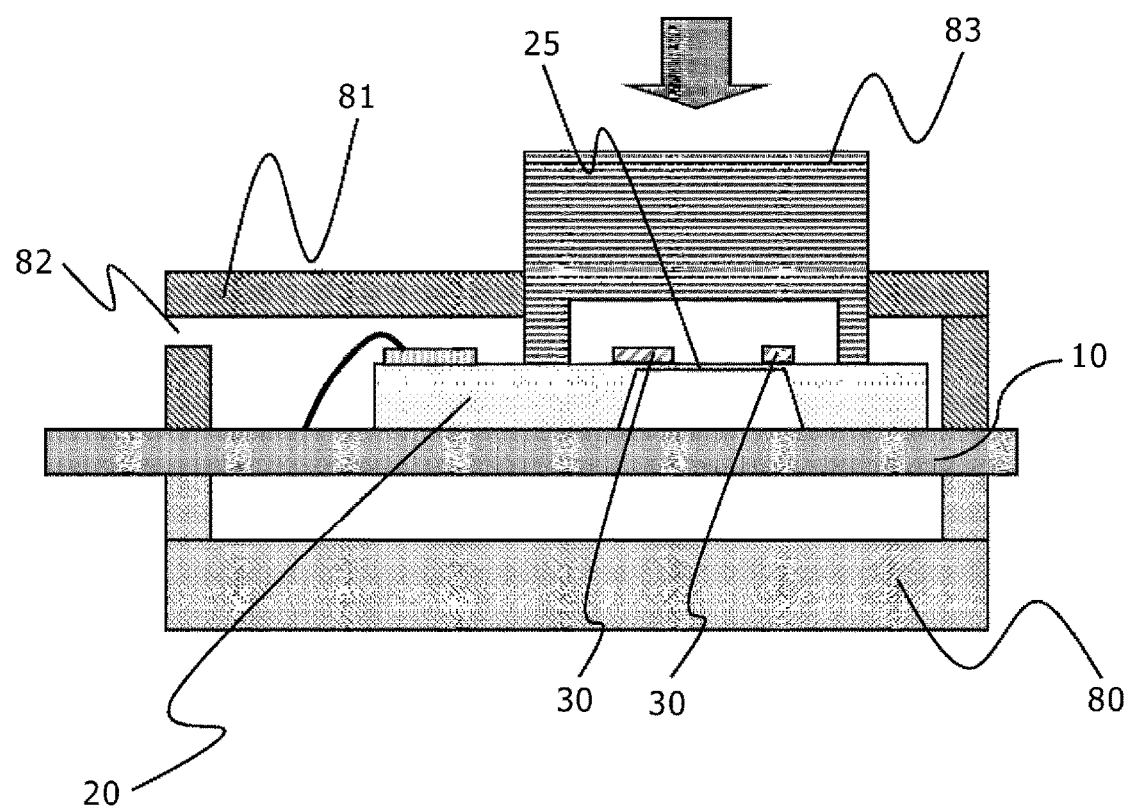
FIG. 3 is a schematic explanatory view showing how molding is performed on the first embodiment.

Molding on the first embodiment will be explained below with reference to FIGS. 3 and 4. FIG. 3 is a schematic explanatory view showing how molding is performed on the first embodiment, and FIG. 4 is a schematic explanatory view showing how the mold resin flows out in the first embodiment.

As shown in FIG. 3, a semiconductor package of a partially exposed structure is formed with a lower metal mold 80, an upper metal mold 81, and the insertion die 83 provided to be inserted into the upper metal die 81. The thermal airflow sensor having the semiconductor substrate 20 mounted on the lead frame 10 is sandwiched between the lower metal mold 80 and the upper metal mold 81. The insertion die 83 is pressed toward the thin-wall portion 25 and other parts to be partially exposed so that these locations will not be covered with the mold resin 60. The resin is then allowed to flow in through an insertion opening 82 to produce the semiconductor package of the partially exposed structure. The insertion opening 82 may be provided through either the lower metal mold 80 or the upper metal mold 81. When the pressing portion of the insertion die 83 is pressed toward the substrate surface, the area toward which the insertion die 83 is pressed is not sealed with the resin and thus exposed partially. However, since the thin-wall portion 25 is thinner than the other portions, pressing the insertion die 83 directly toward the thin-wall portion 25 can deform the thin-wall portion 25, resulting in flow rate detection errors. Thus the insertion die 81 is structured to have a concave part on its pressing portion so that the thin-wall portion 25 will be fitted into the concave part. The pressing portion formed on the peripheral edge of the concave part is pressed toward the substrate surface so that the insertion die 83 will not come into direct contact with the thin-wall portion 25 upon sealing with the resin. This prevents the load with which to press the insertion die 83 from being applied to the thin-wall portion 25, so that the thin-wall portion is prevented from getting deformed when the area including the thin-wall portion is partially exposed during sealing with the resin.

Figure 4:
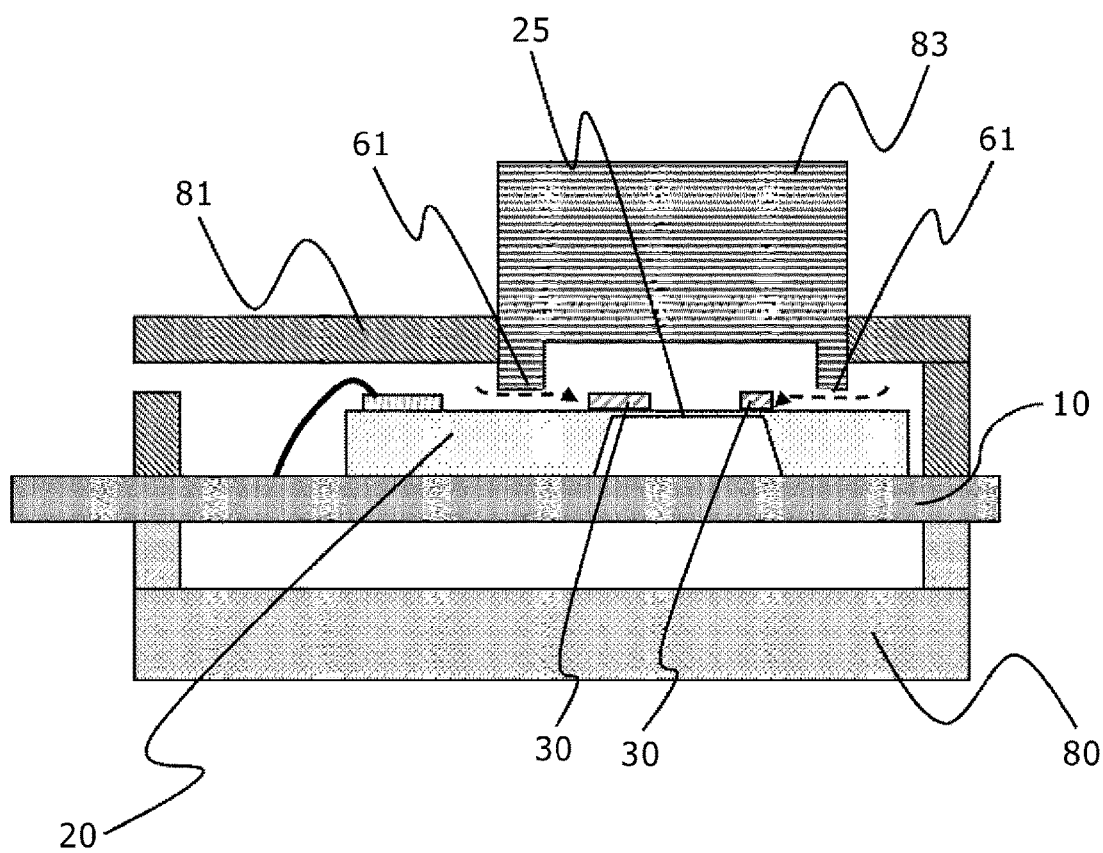
FIG. 4 is a schematic explanatory view showing how the mold resin flows out in the first embodiment.

As shown in FIG. 4, if the load with which to press the insertion die 83 is insufficient, a gap may be formed between the surface of the thermal airflow sensor and the insertion die. If the resin is poured in this state, the resin may flow out through the gap 61 between the insertion die 83 and the surface of the thermal airflow sensor. However, the first embodiment of the present invention offers a structure in which the organic protective film. 30 encloses the heating resistor 21 and is located in an area partially exposed from the mold resin 60. In this structure, the organic protective film 30 stems the resin 60 that may leak out through the gap 61, so that the leaking resin is controlled from reaching the thin-wall portion 25. Even if the force with which to press the insertion die 83 is insufficient and even if a product is manufactured in which the mold resin 60 leaks to the semiconductor device portion, the performance specification of the product are met as long as the leak does not reach the thin-wall portion 25 that is the sensing area. Thus according to the first embodiment of the present invention, the reliability of the thermal airflow sensor is ensured even where insufficient load on the insertion die 83 results in resin leakage.

Here, consider the case where the insertion die 83 is pressed under movement control. Since there are variations in the height of the surface of the semiconductor substrate 20 from one product to another, a semiconductor substrate 20 with a higher height than usual is subject to greater load, than usual. Too much load can deform the sensor element. On the other hand, a semiconductor substrate with a lower height than usual forms the gap 61 between the insertion die 83 and the surface of the thermal airflow sensor, and the resin may leak through the gap 61. According to the first embodiment of the present invention, the reliability of the thermal airflow sensor is ensured even when the load on the insertion die 83 is insufficient. This means that during mass production, the manufacturing margin may be increased in a manner favoring lower load on the insertion die 83. That in turn improves throughput yield.

Moreover, since the thin-wall portion 25 is made of an inorganic material and formed thin and fragile in order to boost thermal insulation characteristics, the thin-wall portion 25 needs to have its strength improved against the impact of dust. In particular, the peripheral edge of the thin-wall-portion 25 is more vulnerable to the impact of dust than the other portions. Thus an inner peripheral edge of the organic protective film 30 is positioned at the thin-wall portion 25 as shown in FIG. 1 so that the peripheral edge of the thin-wall portion. 25 is covered with the organic protective film 20 that absorbs the shock of the impact of dust. With this structure, the strength of the thin-wall portion 25 against the impact of the dust included in the intake air is raised. The thermal airflow sensor consequently improves its contamination resistance and higher reliability in its implementation.

The second embodiment of the present invention will now be explained with reference to FIGS. 5 through 9. The same structures as those of the first embodiment will not be discussed further.

The structural views of the sensor element constituting the second embodiment of this invention will be explained below with reference to FIGS. 5 and 6. Here, FIG. 5 is a set of structural views of the sensor element yet to be molded as the second embodiment, and FIG. 6 is a set of structural views of the sensor element molded as the second embodiment.

Figure 5:
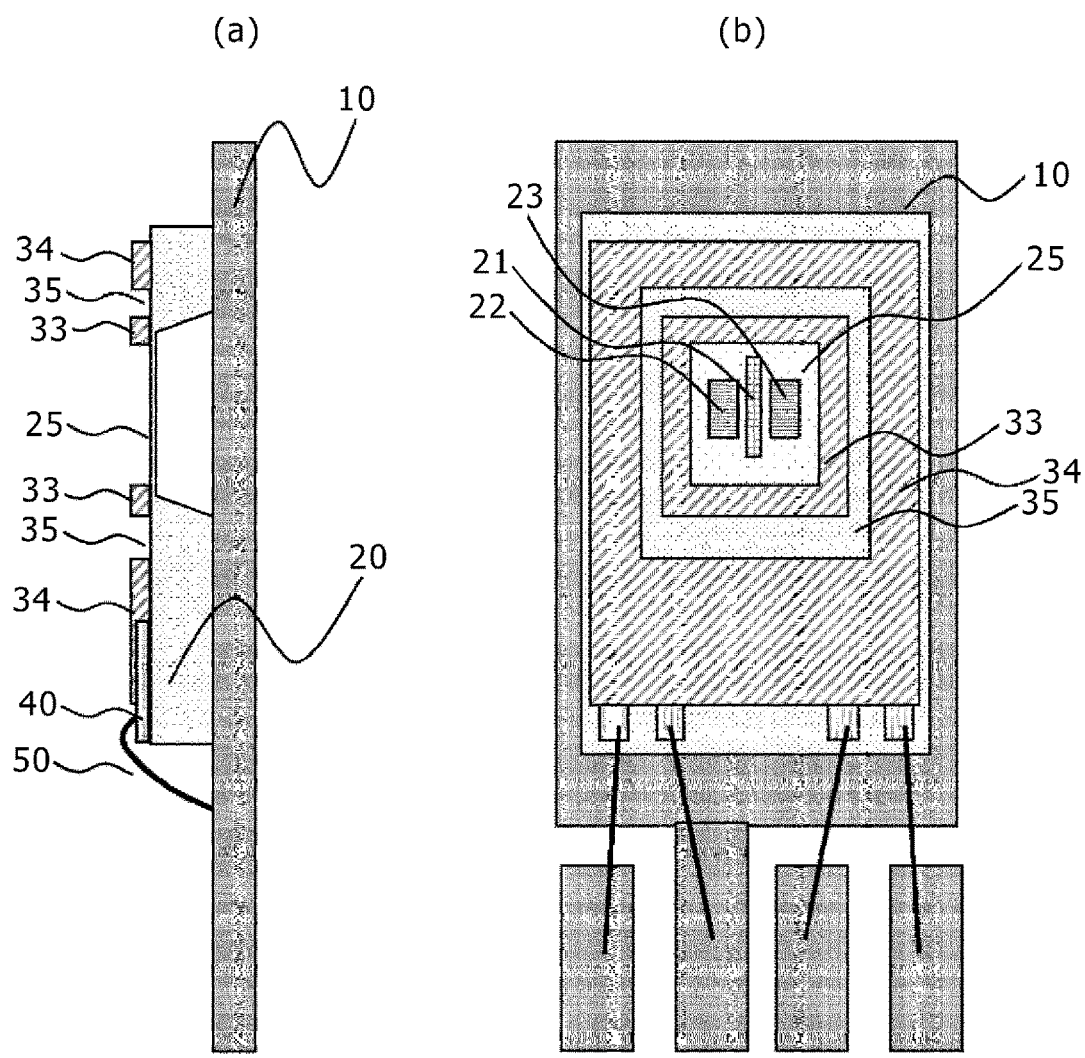
FIG. 5 is a set of structural views of a sensor element yet to be molded as a second and a third embodiment of the present invention, where

As shown in FIG. 5, the organic protective film 30 provided, over the semiconductor substrate 20 has an exposure portion for partially exposing the thin-wall portion 25 so that the heating element 21, upstream resistance temperature detector 22, and downstream resistance temperature detector 23 are exposed to the medium to be measured, the organic protective film 30 also having a slit 35 formed in a manner enclosing the thin-wall portion 25. The slit 35 seamlessly encloses the thin-wall portion 25 so that even if resin leakage occurs during resin molding, the slit 35 traps the mold resin 60 and prevents it from flowing to the thin-wall portion 25. The organic protective film 30 is provided to protect the rim of the thin-wall portion 25, which boosts the strength of the thin-wall portion 25 against the impact of the dust included in the intake air. The slit 35 partially exposes the semiconductor substrate 20 from the organic protective film 30, thus forming a stagger between the exposed surface of the semiconductor substrate 20 and the organic protective film 30. Preferably, there should be provided a structure in which the Al wiring 40 is covered with the organic protective film 30 for protection against corrosive components such as water.

Figure 6:
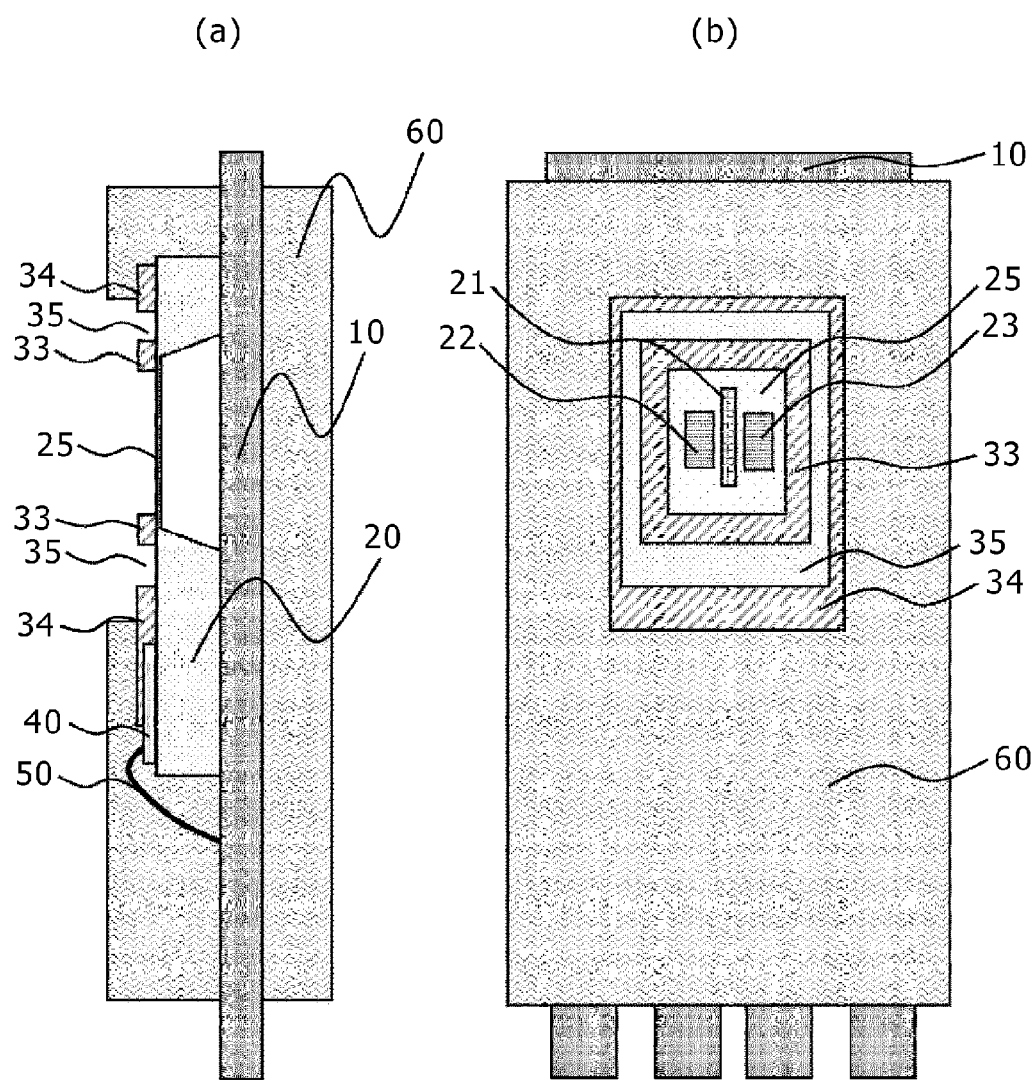
FIG. 6 is a set of structural views of the sensor element molded as the second embodiment, where

And as shown in FIG. 6, the semiconductor substrate 20 and lead frame 10 are sealed with the mold resin 60 in a manner partially exposing the entire inner peripheral edge and the outer peripheral edge of the slit 35 from the mold resin 60. With the entire inner peripheral edge of the slit 35 located in an area partially exposed from the mold resin, even if the mold resin 60 leaks out through the gap 61 as shown in FIG. 8, the slit 35 traps the mold resin 60 and prevents it from reaching the thin-wall portion 25.

Figure 7:
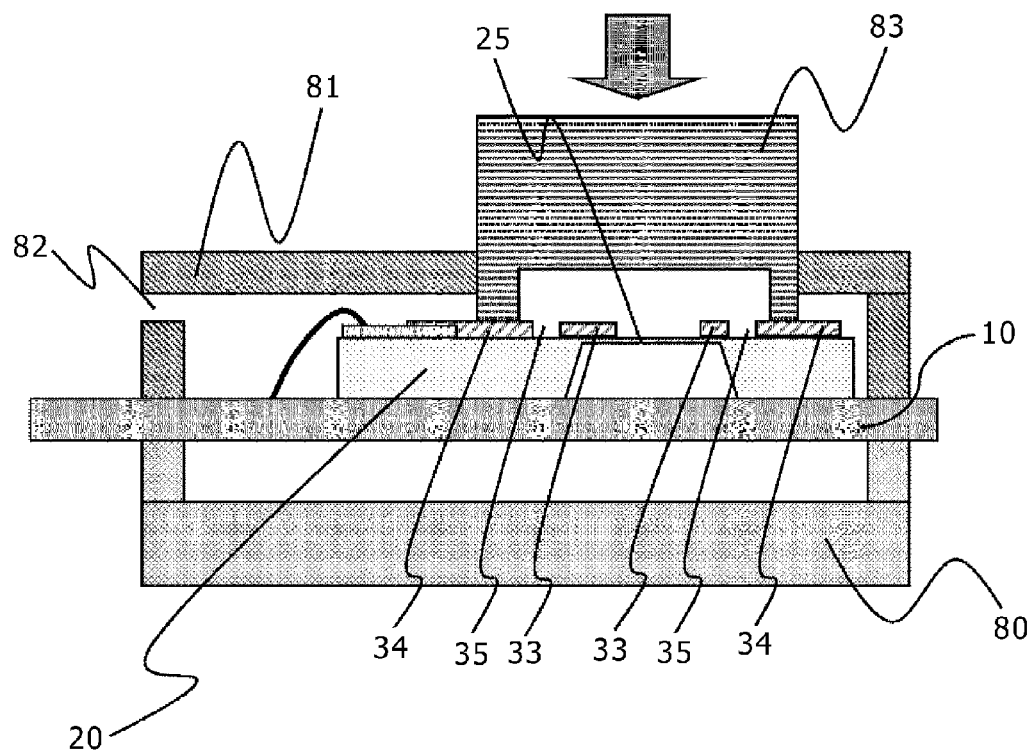
FIG. 7 is a schematic explanatory view showing how molding is performed on the second embodiment.

Molding on the second embodiment will be explained below with reference to FIGS. 7 and 8. FIG. 7 is a schematic explanatory view showing how molding is performed on the second embodiment, and FIG. 8 is a schematic explanatory view showing how the mold resin flows out in the second embodiment.

As shown in FIG. 7, when the semiconductor package of a partially exposed structure of the second embodiment is produced, the pressing portion of the insertion die 83 is pressed toward the organic protective film 30. Because the organic protective film 30 acts as a buffer material that absorbs the stress propagated to the thin-wall portion 25, deformation of the thin-wall portion 25 is restrained during molding. Thus according to the second embodiment of the present invention, detection errors attributable to the deformation of the thin-wall portion 25 are restrained, and hence that the reliability of the thermal airflow sensor is improved.

Figure 9:
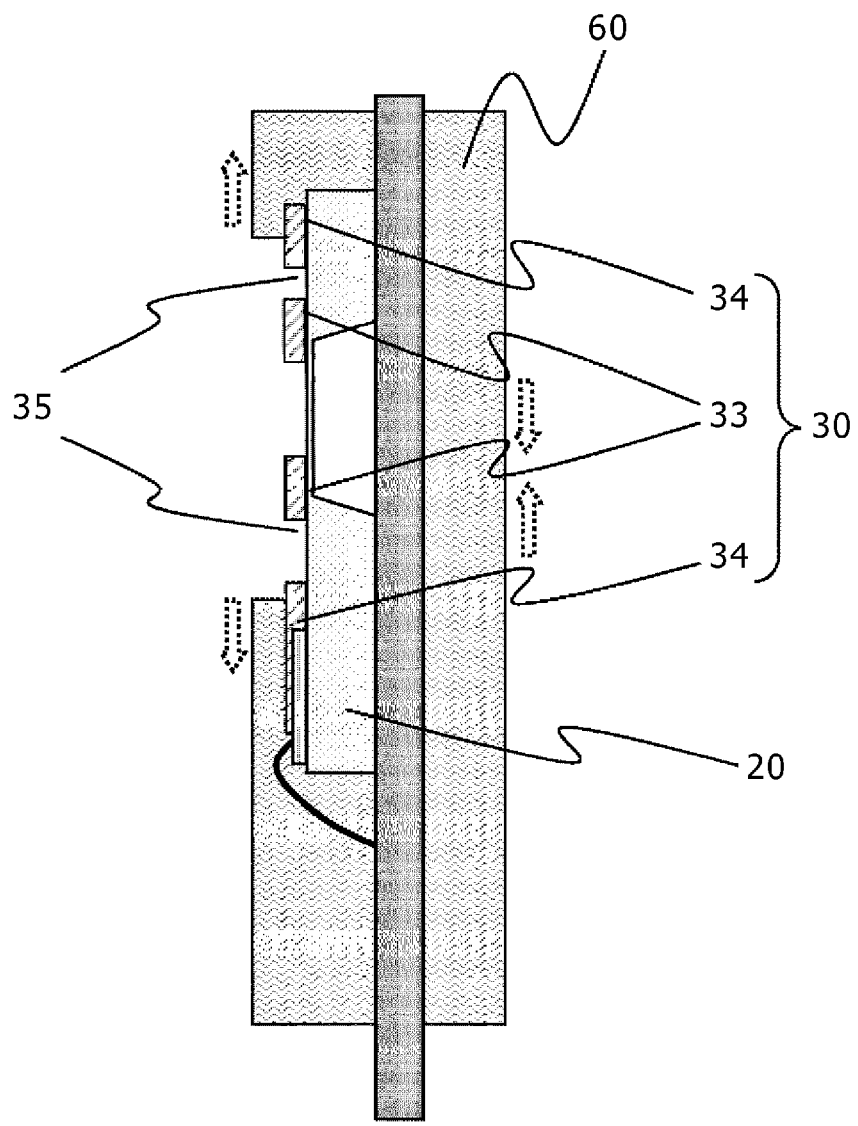
FIG. 9 is an explanatory view of a slit.

Further advantages of providing the slit 35 in the organic protective film 30 will be explained below with reference to FIG. 9.

In a structure where the mold resin 60 is applied to the thermal airflow sensor with the organic protective film 30 interposed therebetween, the organic protective film 30 is stressed due to resin contraction after molding. Where the organic protective film 30 is shaped to communicate with the thin-wall portion edge, the stress caused by resin contraction of the mold resin 60 may reach the edge of the thin-wall portion 25 and affect flow rate characteristics. According to the second embodiment of this invention, however, the slit portion 35 is formed in a manner isolating an organic protective film 30 from an organic protective film 32 formed over the thin-wall portion edge, the organic protective 30 being positioned in an area where the mold resin 60 is in contact with the thermal airflow sensor. With this structure, the stress does not reach the organic protective film 32 formed over the thin-wall portion edge by way of the organic protective film 30. This provides an advantage of reducing the stress-induced effects on flow rate characteristics.

The third embodiment of the present invention will now be explained with reference to FIGS. 10 through 12. The same structures as those of the second embodiment will not be discussed further.

Figure 10:
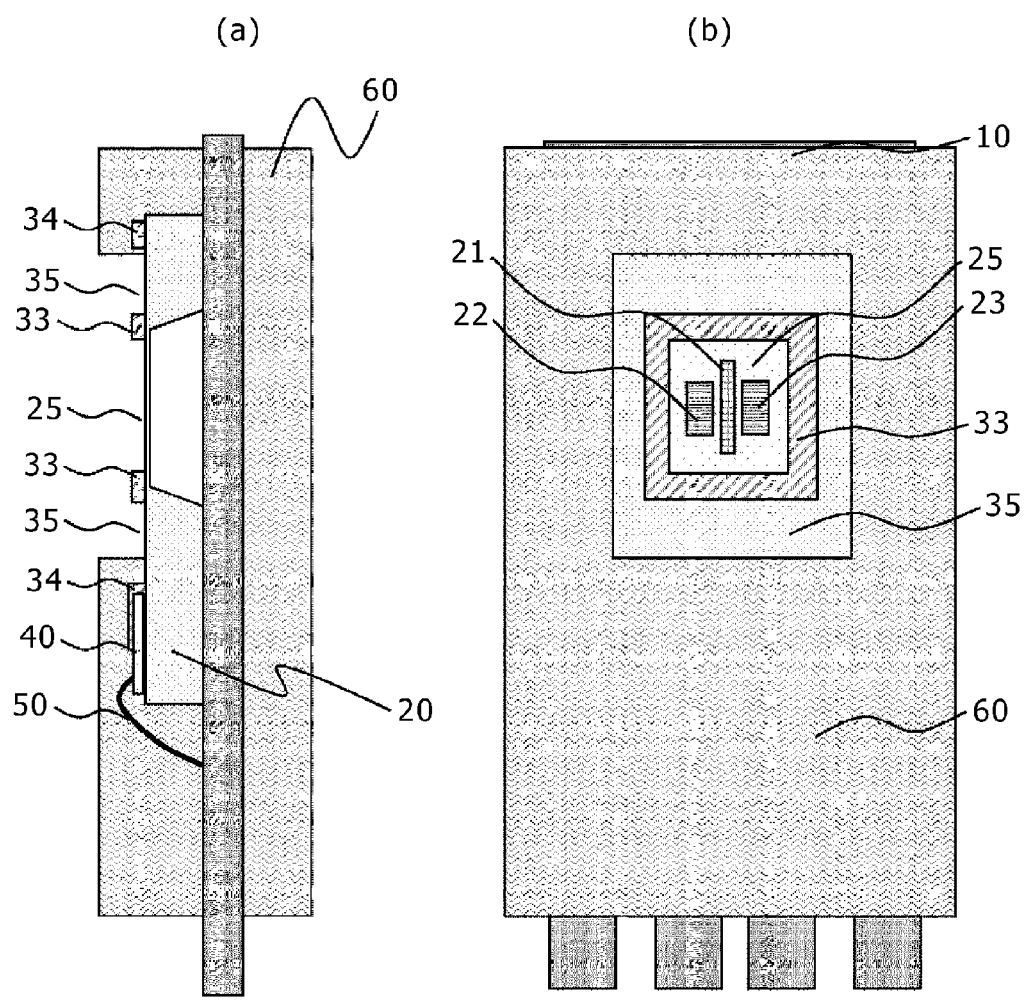
FIG. 10 is a set of structural views showing the sensor element molded as the third embodiment, where
Figure 11:
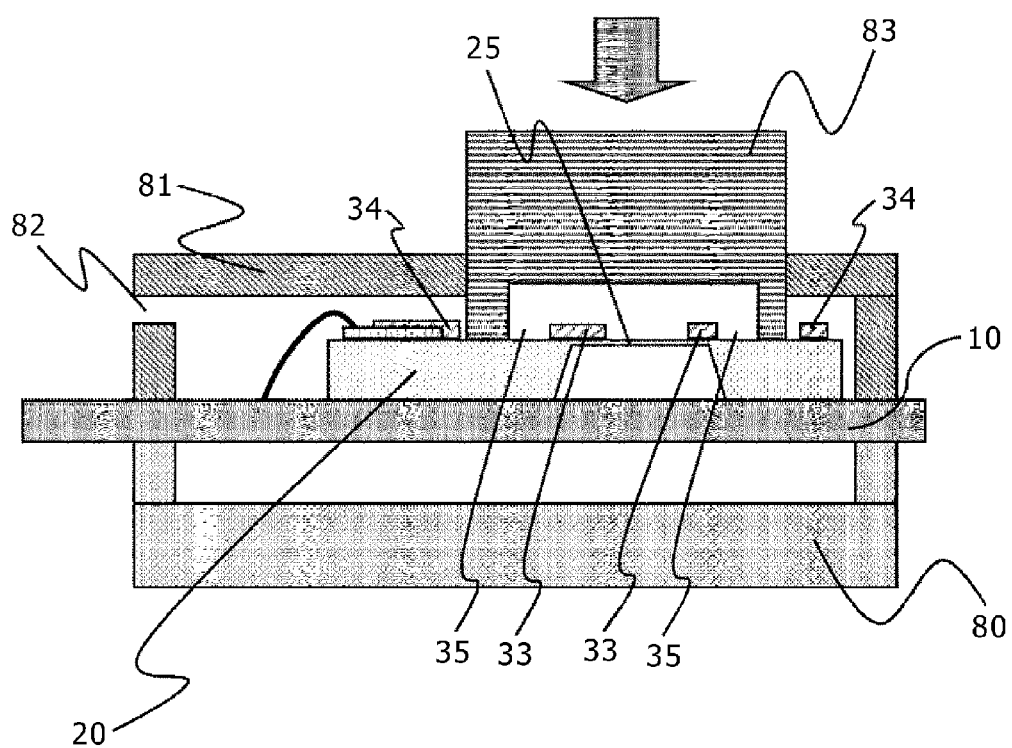
FIG. 11 is a schematic explanatory view showing how molding is performed on the third embodiment.
Figure 12:
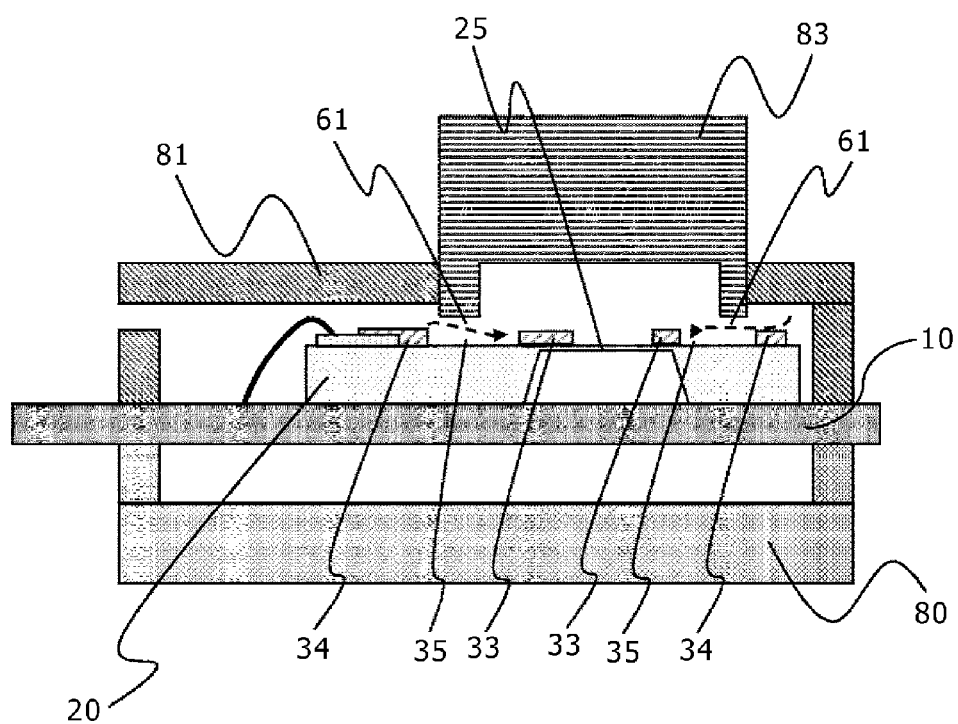
FIG. 12 is a schematic explanatory view showing how the mold resin flows out in the third embodiment.

As shown in FIGS. 10 and 11, during resin molding, slit inner periphery-side organic protective film 33 is positioned in a manner partially exposed from the mold resin 60, and a slit outer periphery-side organic protective film 34 is covered with the mold resin 60. With the slit inner periphery-side organic protective film 33 located in an area partially exposed from the mold resin 60, even if the mold resin 60 flows out through the gap 61 as shown in FIG. 12, the mold resin 60 is stemmed by the protective film 33 and thereby prevented from reaching the thin-wall portion 25.

Whereas the organic protective film 30 protects the Al wiring 40 from corrosive components such as water, there is fear that the organic protective film 30 itself may absorb water and transfer it to the Al wiring 40. In the structure according to the third embodiment of this invention, the organic protective film 34 covering the Al wiring 40 in the mold resin 60 does not come into direct contact with air. The structure thus prevents corrosion of the Al wiring. Furthermore, the organic protective film 34 is capable of stemming corrosive components such as water coming in through the interface between the semiconductor substrate 20 and the mold resin 60, thereby reducing the infiltration of corrosive components including water into the Al wiring 40. Thus in the structure according to the third embodiment of this invention, possible corrosion of the Al wiring 40 is further reduced and reliability is improved accordingly.

Moreover, as with the second embodiment, the protective film sandwiched by the mold resin and the semiconductor substrate is independent of the protective film formed over the thin-wall portion. This structure helps lower the stress-induced effects on the thin-wall portion.

Figure 13:
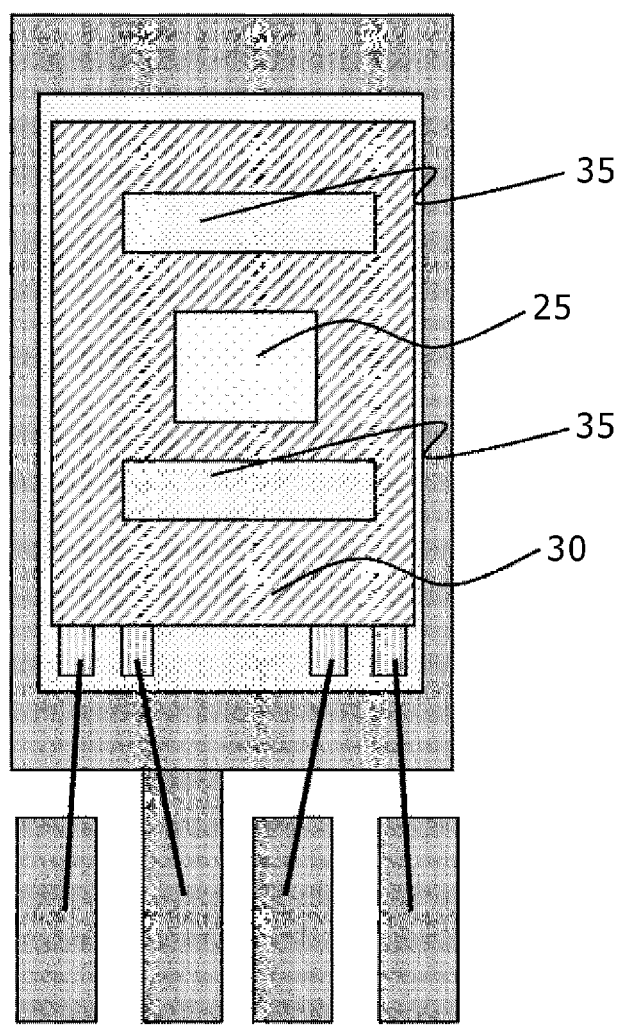
FIG. 13 is a structural view showing a sensor element yet to be molded as a fourth embodiment of the present invention.

The fourth embodiment of this invention will now be explained with reference to FIG. 13.

Whereas each of the slits of the first embodiment are placed distantly over the entire periphery, the effect of preventing the leakage of the mold resin is still obtained even when the slit is formed on one side alone or in one direction only.

If it is known beforehand that the insertion die tends to be in uneven contact with the semiconductor substrate 20, the direction in which a gap is highly likely to occur can be identified. If the slit is formed in that direction, the slit prevents the leaking mold resin 60 from reaching the thin-wall portion 25, such that the throughput yield can be significantly improved.

The same applies to the above-mentioned stress-induced effects. If the stress of the resin is expected to occur in a specific direction through evaluation of actual products and/or through analysis, the slit may be formed in that direction so as to improve the reliability of the thin-wall portion effectively.

The fifth embodiment of the present invention will now be explained with reference to FIG. 14.

Figure 14:
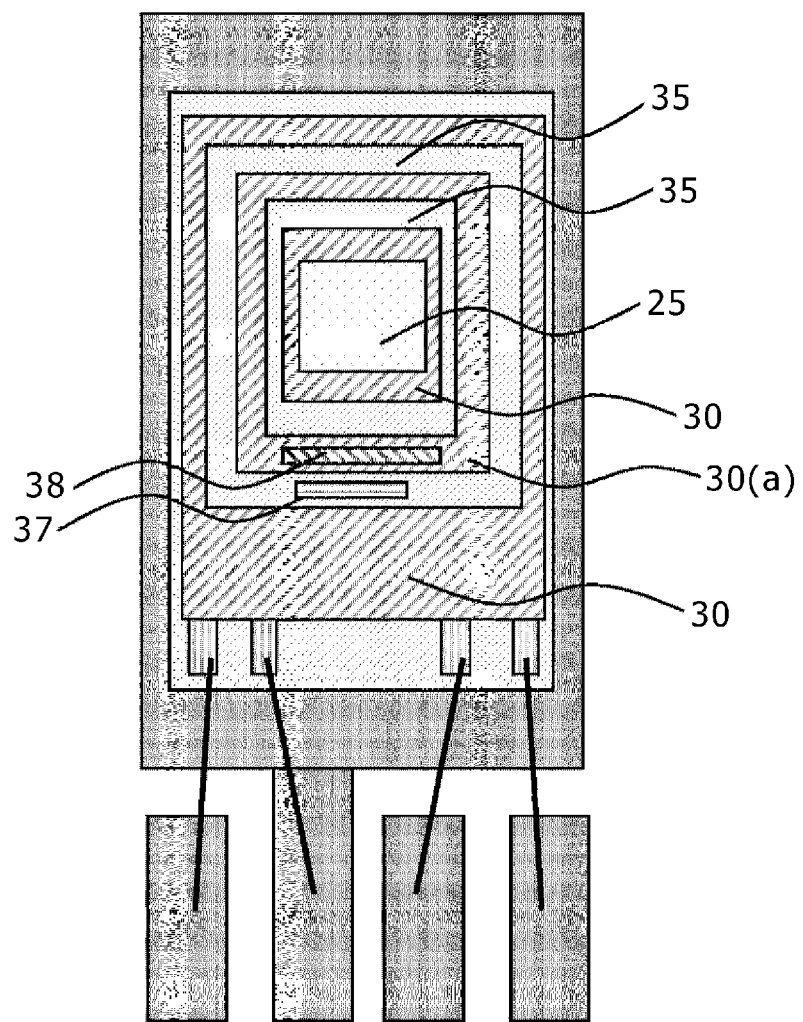
FIG. 14 is a structural view showing a sensor element yet to be molded as a fifth embodiment of the present invention.

Whereas the slit of the second embodiment is shaped as nested circumferences with space interposed, staggered multiple slits formed as shown in FIG. 14 also provide the effect of preventing the above-mentioned leakage of the mold resin.

One object of forming multi-staggered slits is to protect a resistor 37, formed over the semiconductor substrate, from the impact of dust. Where it is desired, as in the case of the thin-wall portion 25, to expose a temperature sensor 37 formed over the semiconductor substrate for the sake of better thermal responsiveness, the protective film 30 needs to be formed inside the slit provided in the second embodiment. In this case, multiple slits are formed staggered to prevent leakage of the mold resin 60. In such a structure, the multi-staggered slits are also effective in preventing the mold resin 60 from leaking.

In the first through the fifth embodiments, the organic protective film 30 should preferably be made of polyimide. While the thin-wall portion 25 is subject to high temperatures as a result of the heating resistor 21 being heated so as to measure the flow rate of intake air, polyimide has good resistance to heat and minimizes heat-induced degradation of the material. This makes it possible to improve the strength of a measuring element 1 against the impact of solid particles for an extended period of time.

Even if a product is manufactured in which the mold resin 60 has leaked to the semiconductor device portion, as long as the leakage does not reach the thin-wall portion 25 that is the sensing area, the performance specifications of the product are met. Where the structure is provided in which the leaking resin is unlikely to reach the thin-wall portion 25, a decline in throughput yield can be controlled.

When the organic protective film 30 is made of polyimide, there can be provided a thermal airflow sensor that improves its strength of the insulating film over the thin-wall portion toward dust and yet controls the drop in throughput yield without increase in cost, even with the semiconductor device sealed with the resin in a manner being partially exposed.

REFERENCE NUMERALS

1 Intake air
2 Semiconductor package
3 Housing
4 Flange.
5 Intake pipe
6 Auxiliary passage
7 Flow rate detection portion
8 Connector terminal
10 Lead frame (substrate support member)
20 Semiconductor substrate
21 Heating resistor
22 Upstream resistance temperature detector
23 Downstream resistance temperature detector
25 Thin-wall portion
30 organic protective film
33 Slit inner periphery-side organic protective film
34 Slit outer periphery-side organic protective film
35 Slit
36 Slit
37 Resistor formed over semiconductor substrate
38 Temperature sensor formed over semiconductor substrate
40 Al wiring
50 Bonding wire
60 Mold resin
61 Boundary between mold resin and thermal flow sensor
80 Lower metal mold
81 Upper metal mold
82 Resin pouring hole
83 Insertion die

The invention claimed is:

1. A thermal airflow sensor comprising:
   a semiconductor substrate having a thin-wall portion, a heating resistor provided over the thin-wall portion, and resistance temperature detectors installed upstream and downstream of the heating resistor;
   a protective film provided over the semiconductor substrate; and
   a resin that seals the semiconductor substrate, the resin further including an exposure portion for partially exposing an area including the thin-wall portion, wherein
   the protective film has an outer peripheral edge that: i) does not directly overlap the thin-wall portion, and ii) is inside of the exposure portion.

2. The thermal airflow sensor according to claim 1, wherein the protective film is made of an organic material, the protective film having an inner peripheral edge located over the thin-wall portion.

3. The thermal airflow sensor according to claim 2, further comprising a second protective film provided over the semiconductor substrate and outside the protective film.

4. The thermal airflow sensor according to claim 3, wherein the second protective film is provided in a manner enclosing the protective film.

5. The thermal airflow sensor according to claim 4, wherein the second protective film is provided entirely in an area covered with the resin.

6. The thermal airflow sensor according to claim 4, wherein the second protective film has an inner peripheral edge located in the exposure portion and an outer peripheral edge located in the area covered with the resin.

7. The thermal airflow sensor according to claim 4, wherein the second protective film is made of a same material as the protective film.

8. The thermal airflow sensor according to claim 7, wherein the organic material is polyimide.

9. The thermal airflow sensor according to claim 4, further comprising a third protective film provided in a manner enclosing the protective film, the second protective film being provided in a manner enclosing the third protective film.

10. The thermal airflow sensor according to claim 9, wherein the third protective film is provided over the exposure portion.

11. The thermal airflow sensor according to claim 9, wherein the third protective film has an inner peripheral edge located over the exposure portion and an outer peripheral edge located in the area covered with the resin.

12. The thermal airflow sensor according to claim 9, wherein the protective film, the second protective film, and the third protective film are made of a same material.

13. A thermal airflow sensor comprising:
   a semiconductor substrate having a thin-wall portion, a heating resistor provided over the thin-wall portion, and resistance temperature detectors installed upstream and downstream of the heating resistor;
   a protective film provided over the semiconductor substrate, the protective film defining a through opening that exposes the thin-wall portion; and
   a resin that seals the semiconductor substrate, the resin further including an exposure portion for partially exposing an area including the thin-wall portion;
   wherein the protective film has a slit located in the exposure portion.

14. The thermal airflow sensor according to claim 13, wherein the protective film is made of an organic material.

15. The thermal airflow sensor according to claim 14, wherein the slit is provided in a manner seamlessly enclosing the thin-wall portion.

16. The thermal airflow sensor according to claim 15, wherein the slit has an outer peripheral edge located in the area covered with the resin and an inner peripheral edge located in the exposure portion.

17. The thermal airflow sensor according to claim 15, wherein the slit is entirely located in the exposure portion.

* * * * *